(12) United States Patent
Wester

(10) Patent No.: US 6,762,424 B2
(45) Date of Patent: Jul. 13, 2004

(54) PLASMA GENERATION

(75) Inventor: Neil Wester, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/202,422

(22) Filed: Jul. 23, 2002

(65) Prior Publication Data

US 2004/0016894 A1 Jan. 29, 2004

(51) Int. Cl.[7] .............................................. H05H 1/34
(52) U.S. Cl. .............................. 250/504 R; 250/493.1; 378/119
(58) Field of Search .................... 250/504 R, 493.1; 378/119, 122

(56) References Cited

U.S. PATENT DOCUMENTS 6,566,667 B1 * 5/2003 Partlo et al. ............ 250/504 R

* cited by examiner

Primary Examiner—Kiet T. Nguyen
(74) Attorney, Agent, or Firm—Fish & Richardson P.C.

(57) ABSTRACT

A photolithography tool includes an anode and a cathode composed of a first material and a second material. The second material has a lower work function than the first material. Electrons emitted from the cathode ionize a gas into a plasma that generates EUV light. The EUV light is focused on a mask to produce an image of a circuit pattern. The image is projected on a semiconductor wafer to produce a circuit.

44 Claims, 3 Drawing Sheets

GAS, 103

PLASMA GENERATION

TECHNICAL FIELD

This invention relates to plasma generation for photolithography.

BACKGROUND

Photolithography systems are used to produce circuit patterns on semiconductor wafers. To produce devices with smaller dimensions, the optical resolving power of the photolithography system needs to be increased. Because optical resolving power is proportional to the wavelength of light, a light source with a shorter wavelength provides better optical resolution capability. Extreme ultraviolet (EUV) light may be utilized in manufacturing microelectronic semiconductor devices with feature sizes less than 100 nm. EUV light may be obtained from a synchrotron or from a high energy plasma. The plasma may be generated by focusing a high energy laser beam onto a stream of inert gas, such as Xenon. The plasma may also be produced by using electron emission in which electrodes emit electrons to ionize a gas to form a plasma. To energize the plasma to generate sufficient EUV light, the electrodes may have to operate at high temperatures with high power flowing through the electrodes. This causes the electrodes to emit particles that contaminate other components in the lithography system, such as a condenser lens. EUV light generated from Xenon plasma has a main component with a wavelength of about 13 nm. FIG. 1 shows an example of an EUV lithography system.

DETAILED DESCRIPTION

Figure 1:
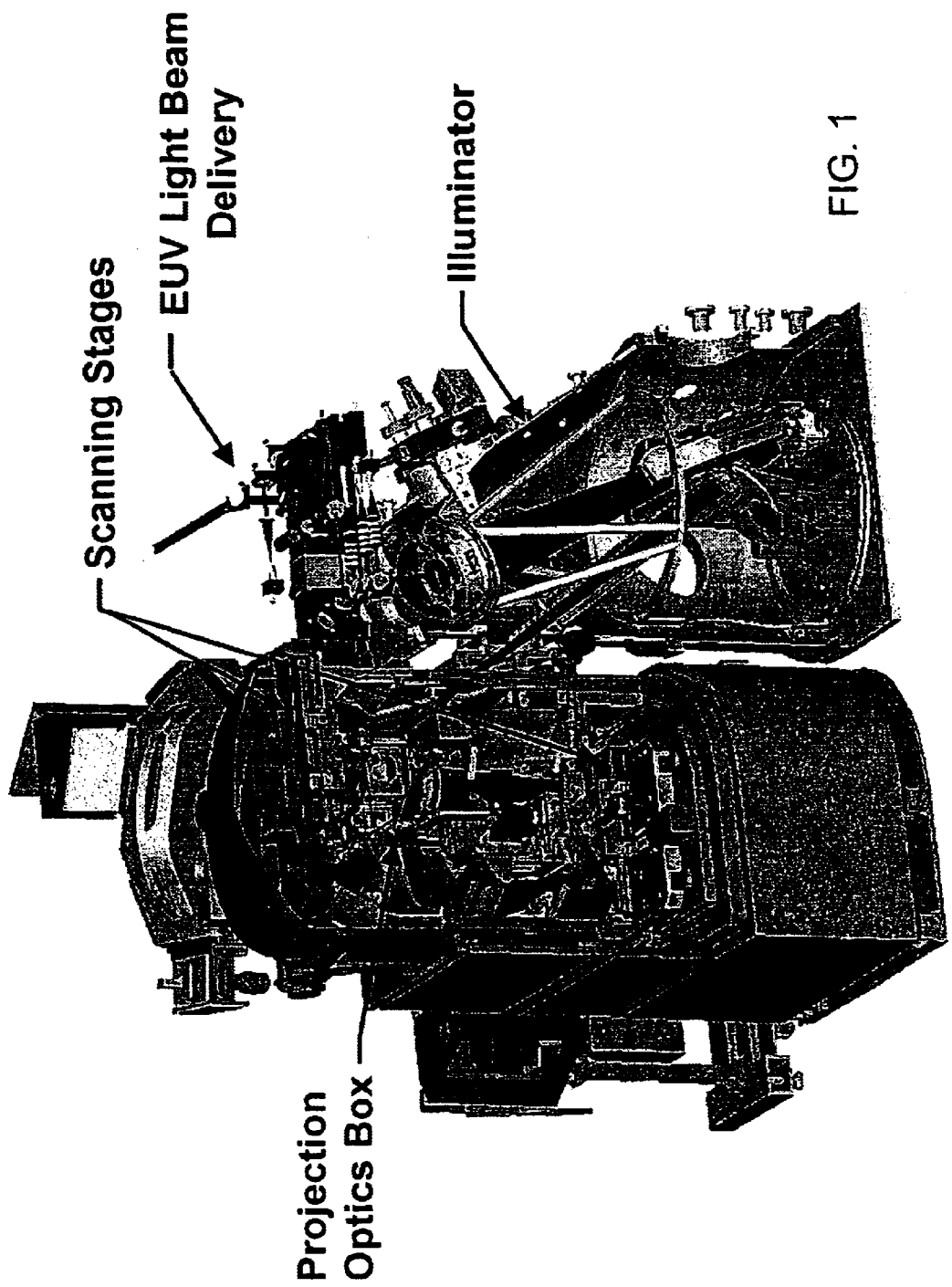
FIGS. 1 and 2 show lithography systems.
Figure 2:
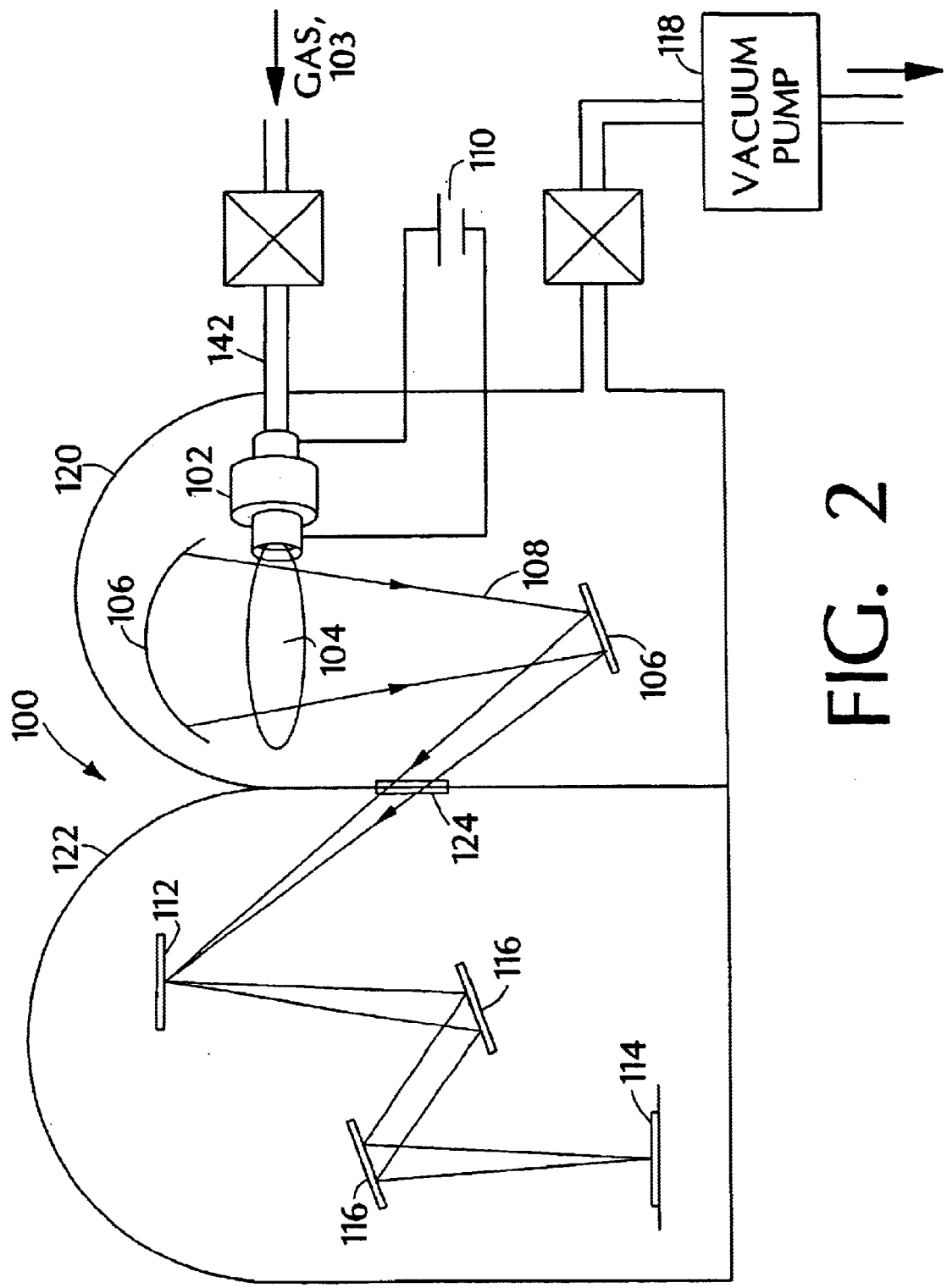

By using zirconiated tungsten electrodes to emit electrons to ionize a gas to form a plasma, EUV light may be produced with less debris, resulting in less contamination in the lithography system. Referring to FIG. 2, an EUV lithographic system 100 includes a chamber 120 for generating EUV light and a chamber 122 for using the EUV light to produce lithography patterns on a wafer 114. Chamber 120 includes an EUV light source 102 that uses electron emissions to ionize a stream of gas (e.g., Xenon gas) to produce a plasma 104. Plasma 104 emits EUV light 108 that is collected by condenser mirrors 106 and projected through a filter 124 positioned between chambers 120 and 122. (For clarity of illustration, several mirrors and lenses are omitted in the figure.) The EUV light is focused onto a reflective mask 112 having enlarged circuit patterns. EUV light reflected from mask 112 is projected onto wafer 114 by a reduction camera 116 to generate circuit patterns on the wafer 114. A vacuum pump 118 removes exhaust plasma gas from chamber 120.

Figure 3:
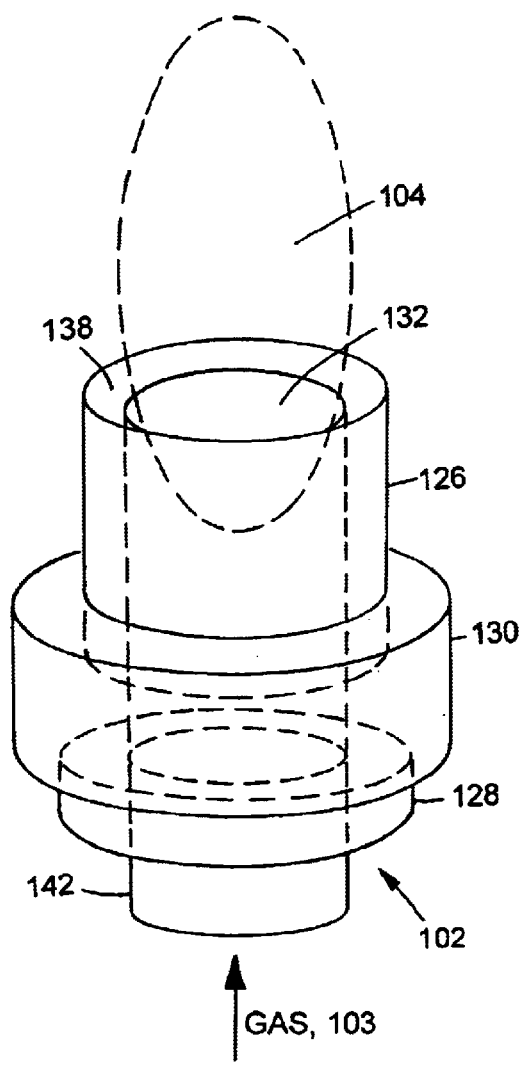
FIGS. 3 and 4 show EUV light sources.
Figure 4:
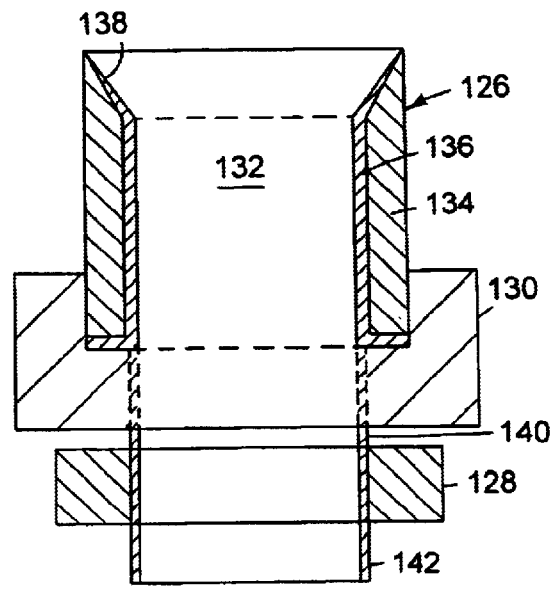

Referring to FIG. 3, EUV light source 102 includes an electrode 126 that functions as a cathode, and an electrode 128 that functions as an anode. A cross-sectional view of light source 102 is shown in FIG. 4. The electrodes 126, 128 have a ring or tubular shape that defines a hollow or tube region 132 that allows a gas to pass through. Electrodes 126 and 128 are connected to a power supply 110 (FIG. 2), which supplies a high DC voltage in the range of 1 to 10 kilo-volts. As the gas 103 passes through the hollow region 132, gas molecules are ionized by electrons emitted from electrode 126 to become a plasma 104. A portion of plasma 104 extends beyond the hollow region defined by electrode 128. Plasma 104 radiates light as the ionized gas molecules transition from the higher energy states back to the lower energy ground state. When Xenon is used to generate plasma 104, the plasma emits light having strong line emissions with wavelengths between 13 to 14 nm.

A dielectric material 130 separates electrodes 126 and 128. Between dielectric 130 and electrode 128 is a tubular region 140 that forms a passage for gas 103 to pass through. A pipe 142 connects light source 102 to a container (not shown) having gas 103.

Electrode 126 includes a tungsten core 134 in the shape of a sleeve with a conical nozzle 138 at one end. The inside wall of the tungsten core 134 is coated with a layer 136 of zirconia (also known as zirconium dioxide, $ZrO_2$) to protect the tungsten sleeve from chemical and mechanical erosion by the plasma 104. The zirconia layer 136 may be formed on the tungsten core 134 by either chemical or physical deposition methods. The thickness of the zirconia layer 136 may be in the range of 0.5 to 10 nm. Zirconia has a work function of about 2.5 to 2.6 eV, while tungsten has a work function of about 4.5 eV. Because zirconia has a lower work function than tungsten, it is easier for electrons to be emitted from a zirconia surface, reducing damage to the electrode. Zirconium dioxide is the stable form of zirconium oxide at room temperature; it is possible that zirconia dioxide may change to other forms of zirconium oxide at higher temperatures.

Zirconia also has a stronger resistance to chemical and mechanical erosion. Electrode 126 operates under high temperature, high voltage, and high current conditions, so without protection of the zirconia layer 136, electrode 126 wears down rapidly and has to be replaced often. Also, tungsten reacts with plasma gas at high temperature to form materials that become debris in chamber 120. The debris contaminates other components (e.g., condenser mirrors 106) in chamber 120. By adding the zirconia layer 136 on the tungsten core 134, damage to electrode 126 is reduced, which results in less debris in chamber 120, improving overall performance of system 100.

Materials other than zirconia may be used to coat the tungsten core 134. Examples of such materials include cesium oxide (work function~2.15 eV), rubidium oxide (work function~2.2 eV), strontium oxide (work function~2.6 eV), and barium oxide (work function~2.7 eV).

Electrode 128 may be tungsten, tantalum, or another refractory metal with a high melting point. Because plasma 104 is generated at a distance from electrode 128, electrode 128 may or may not be coated with zirconia.

An example of the electrodes 126 and 128 without the zirconia coating may be found in the EUV-Lamp manufactured by AIXUV GmbH, Aachen, Germany.

Although some implementations have been described above, other embodiments are also within the scope of the following claims.

For example, the shape of the electrode 126 may be different depending on the shape and position of plasma 104 that is required. The shape of the electrode 128 may be different. Electrode 126 may include a core that is composed of materials other than tungsten, such as tantalum. In applications that does not require the cathode to have strong mechanical strength or in applications where the cathode is supported by other structures, electrode 126 may also comprise a single material (e.g., zirconia) that has a low work function. Plasma 104 may be generated from other gases to produce light with different wavelengths.

What is claimed is:

1. An apparatus comprising:
 a first electrode that includes a first material and a second material bonded to the first material, the second material having a lower work function than the first material; and
 a second electrode, the first and second electrodes defining a passageway for gas, the first and second electrodes being electrically isolated.

2. The apparatus of claim 1 in which the second material comprises zirconium oxide.

3. The apparatus of claim 1 in which the second material comprises cesium oxide, rubidium oxide, strontium oxide, or barium oxide.

4. The apparatus of claim 1 in which the first material comprises tungsten or tantalum.

5. The apparatus of claim 4 in which the second material comprises zirconium oxide.

6. The apparatus of claim 4 in which the second material comprises cesium oxide, rubidium oxide, strontium oxide, or barium oxide.

7. The apparatus of claim 5 in which the second material has a thickness between 0.5 to 10 nm.

8. The apparatus of claim 1 in which the second electrode comprises tungsten or tantalum.

9. The apparatus of claim 1, further comprising a power supply to supply electric power to the first and second electrodes to cause the first electrode to emit electrons to ionize the gas to form a plasma.

10. The apparatus of claim 1 in which the first electrode emits electrons to ionize the gas into a plasma.

11. The apparatus of claim 10 in which the second material is bonded to a portion of the first material so that the first material does not come into contact with the plasma.

12. The apparatus of claim 10 in which the gas is selected to emit light having a wavelength less than 300 nm when ionized into a plasma.

13. The apparatus of claim 10, further comprising a condenser to collect the light generated by the plasma.

14. The apparatus of claim 13, further comprising a mask illuminated by the light collected by the condenser.

15. The apparatus of claim 14, further comprising a lens assembly to focus light reflected from the mask onto a semiconductor substrate.

16. An apparatus comprising:
 a passageway for gas;
 a first electrode; and
 a second electrode to emit electrons that ionize the gas into a plasma, the second electrode including a first material and a second material bonded to the first material, the second material having a lower work function than the first material.

17. The apparatus of claim 16 in which the second material comprises zirconium oxide.

18. The apparatus of claim 16 in which the second material comprises cesium oxide, rubidium oxide, strontium oxide, or barium oxide.

19. The apparatus of claim 16 in which the first material comprises tungsten or tantalum.

20. The apparatus of claim 19 in which the second material comprises zirconium oxide.

21. An apparatus comprising:
 a passageway for gas;
 a first electrode; and
 a second electrode to emit electrons that ionize the gas into a plasma that emits light, the second electrode having a surface work function lower than 2.66 eV.

22. The apparatus of claim 21 in which the second electrode comprises zirconium oxide.

23. The apparatus of claim 22, further comprising means for using the light to produce an image of an electronic circuit pattern on a substrate.

24. A photolithography tool, comprising:
 a chamber having an inlet to allow a gas to enter the chamber;
 a cathode disposed in the chamber, the cathode having a first material and a second material, the second material having a work function lower than the first material;
 an anode;
 a power supply to supply power to the cathode and the anode to cause the cathode to emit electrons that ionize the gas to form a plasma that emits light;
 a reflective mask having a pattern thereon;
 a light condenser to focus the light onto the mask; and
 a lens assembly to focus an image of the pattern onto a substrate.

25. The photolithography tool of claim 24 in which the first material comprises tungsten or tantalum.

26. The photolithography tool of claim 24 in which the second material comprises zirconium oxide.

27. The photolithography tool of claim 24 in which the second material comprises cesium oxide, rubidium oxide, strontium oxide, or barium oxide.

28. The photolithography tool of claim 24 in which the gas is selected so that the light has a wavelength between 4 nm to 300 nm.

29. The photolithography tool of claim 24 in which the cathode has a shape of a ring or tube that defines a hollow region to allow the gas to pass through.

30. A method comprising:
 passing a gas between a first electrode and a second electrode, the first electrode having a first material and a second material, the second material having a lower work function than the first material; and
 supplying electric power to the first and second electrodes to cause the first electrode to emit electrons to ionize the gas into a plasma.

31. The method of claim 30 in which the second material comprises zirconium oxide.

32. The method of claim 30 in which the second material comprises cesium oxide, rubidium oxide, strontium oxide, or barium oxide.

33. The method of claim 30 in which the first material comprises tungsten or tantalum.

34. The method of claim 33 in which the second material comprises zirconium oxide.

35. The method of claim 33 in which the second material comprises cesium oxide, rubidium oxide, strontium oxide, or barium oxide.

36. The method of claim 30, further comprising using the plasma to generate light.

37. The method of claim 36, further comprising using the light in a photolithography process to produce a circuit pattern on a substrate.

38. A method comprising:
 generating a plasma by using an electrode to emit electrons that ionize a gas into the plasma, the electrode having a first material and a second material, the second material having a lower work function than the first material;

generating light from the plasma; and using the light to form a pattern on a semiconductor substrate.

39. The method of claim 38 in which the first material comprises tungsten or tantalum.

40. The method of claim 39 in which the second material comprises zirconium oxide.

41. The method of claim 39 in which the second material comprises cesium oxide, rubidium oxide, strontium oxide, or barium oxide.

42. A method comprising applying a coating of a first material to a second material to form a first electrode, the first material having a lower work function than the second material, assembling the first electrode with a second electrode to form a plasma generation device in which the electrodes are electrically isolated and a passage is defined through the first and second electrodes for gas that is to be ionized into a plasma.

43. The method of claim 42 in which the first electrode has a shape of a ring or tube that defines a hollow region to allow the gas to pass through.

44. The method of claim 42 further comprising assembling the plasma generation device with a lens assembly to form a lithography tool.

* * * * *